(12) United States Patent
Fest

(10) Patent No.: US 10,763,324 B2
(45) Date of Patent: Sep. 1, 2020

(54) SYSTEMS AND METHODS FOR FORMING A THIN FILM RESISTOR INTEGRATED IN AN INTEGRATED CIRCUIT DEVICE

(71) Applicant: Microchip Technology Incorporated, Chandler, AZ (US)

(72) Inventor: Paul Fest, Chandler, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 16/001,437

(22) Filed: Jun. 6, 2018

(65) Prior Publication Data

US 2019/0035878 A1    Jan. 31, 2019

Related U.S. Application Data

(60) Provisional application No. 62/536,707, filed on Jul. 25, 2017.

(51) Int. Cl.
*H01L 21/02* (2006.01)
*H01L 49/02* (2006.01)
(Continued)

(52) U.S. Cl.
CPC .............. *H01L 28/20* (2013.01); *H01C 7/006* (2013.01); *H01C 17/006* (2013.01);
(Continued)

(58) Field of Classification Search
CPC ... H01L 28/20; H01L 27/0629; H01L 21/707; H01L 23/5228; H01C 17/006; H01C 7/006
See application file for complete search history.

(56) References Cited

U.S. PATENT DOCUMENTS 6,441,447 B1 * 8/2002 Czagas .................. H01L 27/016
257/379
6,717,233 B1 * 4/2004 Haddad ............... H01L 21/8221
257/379
(Continued)

OTHER PUBLICATIONS

International Search Report and Written Opinion, Application No. PCT/US2018/043386, 12 pages, dated Oct. 4, 2018.

*Primary Examiner* — Steven H Loke
*Assistant Examiner* — Samuel Park
(74) *Attorney, Agent, or Firm* — Slayden Grubert Beard PLLC

(57) ABSTRACT

A method is provided for forming an integrated thin film resistor (TFR) in a semiconductor integrated circuit device. A first dielectric layer is deposited on an integrated circuit (IC) structure including conductive contacts, a resistive film (e.g., comprising SiCCr, SiCr, CrSiN, TaN, Ta₂Si, or TiN) is deposited over the first dielectric layer, the resistive film is etched to define the dimensions of the resistive film, and a second dielectric layer is deposited over the resistive film, such that the resistive film is sandwiched between the first and second dielectric layers. An interconnect trench layer may be deposited over the second dielectric layer and etched, e.g., using a single mask, to define openings that expose surfaces of the IC structure contacts and the resistive film. The openings may be filled with a conductive interconnect material, e.g., copper, to contact the exposed surfaces of the conductive contacts and the resistive film.

12 Claims, 3 Drawing Sheets

(51) Int. Cl.
*H01L 27/06* (2006.01)
*H01C 7/00* (2006.01)
*H01C 17/00* (2006.01)
*H01L 21/70* (2006.01)
*H01L 23/522* (2006.01)

(52) U.S. Cl.
CPC ........ *H01L 21/707* (2013.01); *H01L 23/5228* (2013.01); *H01L 27/0629* (2013.01)

(56) References Cited

U.S. PATENT DOCUMENTS

| | | | |
|---|---|---|---|
| 2006/0027878 A1* | 2/2006 | Chinthakindi | H01L 27/0629 257/379 |
| 2006/0181388 A1 | 8/2006 | Chinthakindi et al. | 338/309 |
| 2009/0302993 A1 | 12/2009 | Fujiwara et al. | 338/314 |
| 2012/0228719 A1 | 9/2012 | Harada | 257/381 |
| 2012/0313220 A1 | 12/2012 | Yang et al. | 257/537 |
| 2013/0234292 A1 | 9/2013 | Wei et al. | 257/536 |
| 2013/0328131 A1* | 12/2013 | Lu | H01L 28/24 257/379 |
| 2015/0348908 A1 | 12/2015 | Nagakura | 257/533 |
| 2018/0374915 A1* | 12/2018 | Kim | H01L 23/5226 |

* cited by examiner

SYSTEMS AND METHODS FOR FORMING A THIN FILM RESISTOR INTEGRATED IN AN INTEGRATED CIRCUIT DEVICE

RELATED PATENT APPLICATION

This application claims priority to U.S. Provisional Patent Application No. 62/536,707 filed Jul. 25, 2017, the entire contents of which are hereby incorporated by reference for all purposes.

TECHNICAL FIELD

The present disclosure relates to forming thin film resistors, e.g., systems and methods for forming a thin film resistor integrated in a semiconductor integrated circuit (IC) device.

BACKGROUND

Many integrated circuit ("IC") devices incorporate thin film resistors (TFRs), which provide various advantage over other types of resistors. For example, TFRs may be highly accurate, and may be finely tuned to provide a very precise resistance value. In addition, TFRs typically have a low temperature coefficient of resistance (TCR), e.g., after a suitable annealing process to "tune" the TCR to a near-zero value, which may provide stable operation over a wide range of operating temperatures. Further, TFRs typical have smaller parasitic components which provides advantageous high frequency behavior.

A TFR may include any suitable resistive film formed on or in an insulating substrate. Some common IC-integrated TFR materials include SiCr, SiCCr, TaN, and TiN, although any other suitable materials may be used. One common drawback of thin film resistors is that their fabrication typically requires additional processing steps. For example, multiple masking steps are typically required to form an integrated TFR.

SUMMARY

Embodiments of the present invention provide an improved technique for integrating a thin film resistor (TFR) in a semiconductor integrated circuit (IC) device, which may provide a cost reduction as compared with conventional techniques. For example, some embodiments provide methods and systems for forming an integrated TFR using a single photomask process, as compared with conventions methods that require at least two mask processes.

Some embodiments of the disclosed TFR integration scheme eliminate one mask process by allowing for the tuning of etch stop layers to match the clearing of films over the TFR and conductive contacts (e.g., of neighboring memory cells and/or other IC components) at virtually the same time. In some embodiments, the TFR is sandwiched between two etch stop films, e.g., SiN etch stop films. The thicknesses of the two etch stop films can be varied independently in order to tune the integration of the film to the requirements of the existing technology. This enables the TFR to be integrated into a wide variety of IC technologies.

Further, in some embodiments, the TFR is formed between the contact layer and the metal 1 interconnect layer. This allows for a high temperature anneal of the TFR film without the limitations of copper-based interconnects, for example.

One embodiment provides a method of forming an integrated TFR in a semiconductor integrated circuit device including: forming an integrated circuit structure including at least one conductive contact; forming a first dielectric layer over the integrated circuit structure; forming a resistive film over the first dielectric layer; forming a second dielectric layer over the resistive film, such that the resistive film is arranged between the first and second dielectric layers; forming an interconnect trench layer over the second dielectric layer; performing at least one etch process to define openings that expose both (a) at least one surface of the at least one conductive contact and (b) at least one surface of the resistive film; and at least partially filling the openings with a conductive interconnect material to contact the exposed surfaces of the at least one conductive contact and the resistive film.

Another embodiment provides a semiconductor device including a thin film resistor (TFR) produced using such method.

BRIEF DESCRIPTION OF THE DRAWINGS

Example aspects of the present disclosure are described below in conjunction with the figures, in which.

DETAILED DESCRIPTION OF THE INVENTION

Embodiments of the present invention provide an improved technique for integrating a thin film resistor (TFR) in a semiconductor integrated circuit (IC) device, which may provide a cost reduction as compared with conventional techniques, e.g., by eliminating at least one masking processes. In some embodiments, the TFR is sandwiched between two etch stop films. The thicknesses of the two etch stop films may be independently selected to tune the integration of the film to the requirements of the existing technology, to enable integration of the disclosed TFR integrated into a wide variety of IC technologies.

FIGS. 1-7 illustrate an example method of integrating a thin film resistor (TFR) in a semiconductor integrated circuit (IC) device, according to an example embodiment.

Figure 1:
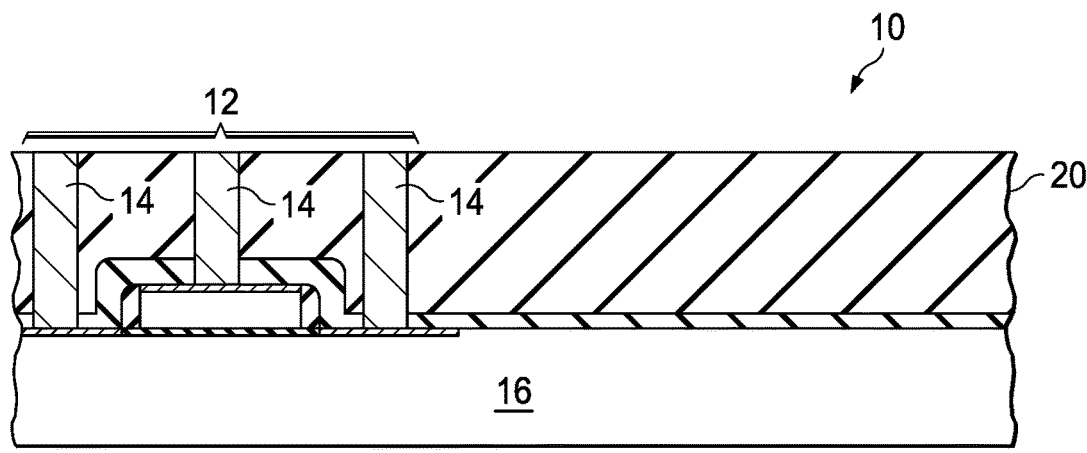
FIGS. 1-7 illustrate an example method of integrating a thin film resistor (TFR) in a semiconductor integrated circuit (IC) device, according to an example embodiment.

FIG. 1 illustrates an example integrated circuit (IC) structure 10, e.g., during the manufacturing of an IC device. In this example, the IC structure 10 includes a transistor structure 12 formed over a substrate 16, with a plurality of conductive contacts 14, e.g., extending though a bulk insulation region 20 formed over transistor structure 12. However, the IC structure 10 may include any other IC devices(s) or structure(s), e.g., one or more full or partial memory cells or memory cell structures. FIG. 1 may represent a state during an IC fabrication process after formation of conductive contacts 14 and a chemical mechanical polish (CMP) process at the top of the structure 10.

Figure 2:
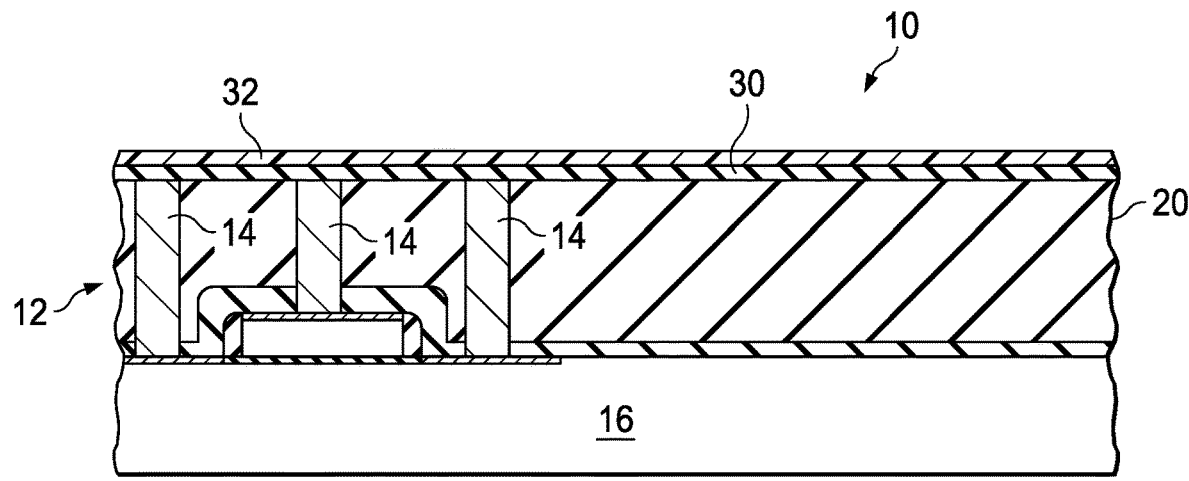

As shown in FIG. 2, a first thin dielectric layer 30, e.g., SiN layer, may be deposited on the IC structure 10, e.g., to protect contacts 14 from a subsequent TFR etch discussed below regarding FIG. 3. A thin resistive film (TFR film) 32, e.g., SiCCr resistor film, may then be deposited on the first dielectric layer 30.

Figure 3:
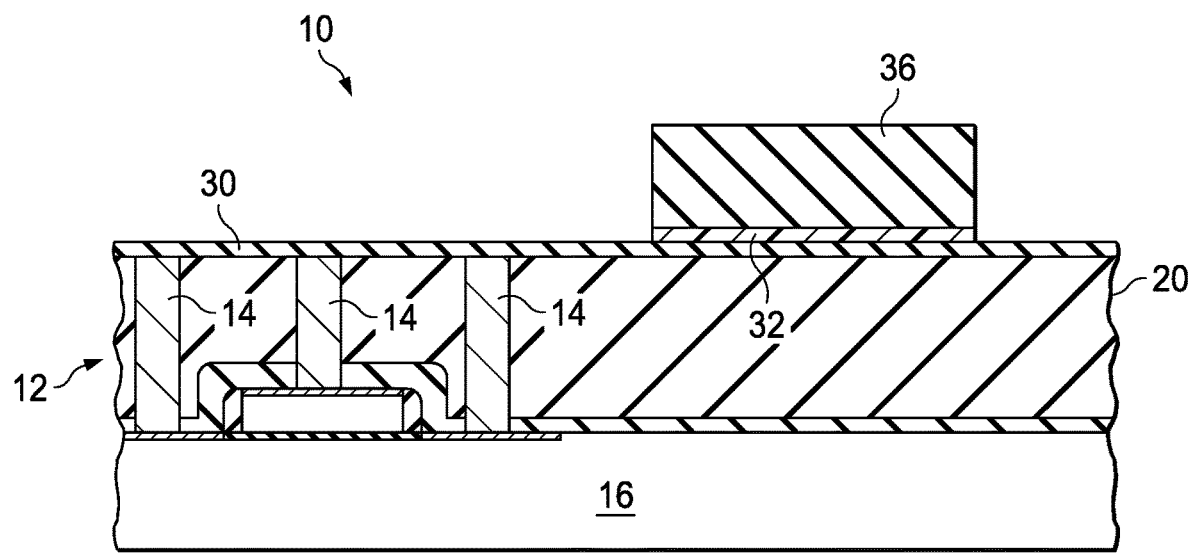

As shown in FIG. 3, the TFR film 32 may be pattered using a patterned mask 36 and etched (e.g., using a wet or dry etch) to define the lateral dimensions of the TFR being formed. In the illustrated example, the TFR film 32, which originally extended laterally over the contacts 14 of the transistor structure 12, may be etched to reduce the width of the TFR 32 such that the resulting TFR does not extend over the transistor contacts. A final thickness of the first thin dielectric layer 30, outside the lateral extent of the TRF film 32, may depend on the thickness of TFR film 32 and the selectively of the TFR etch to the first dielectric layer 30, which acts as an etch stop layer.

Figure 4:
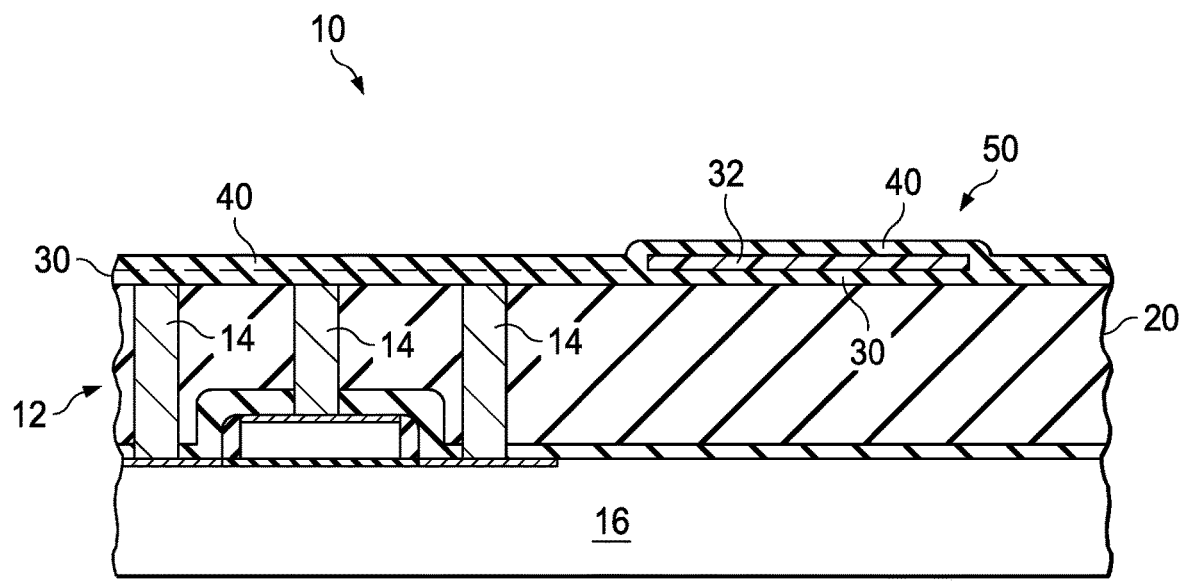

As shown in FIG. 4, the photoresist 36 may be stripped and a second thin dielectric layer 40, e.g., a second SiN layer, may be deposited over the TFR film 32 to subsequently act as an interconnect etch stop layer (e.g., metal 1 interconnect layer). Thus, as shown, the TFR film 32 may be sandwiched between the first and second thin dielectric layers 30 and 40, to thereby define the TFR, indicated at 50.

Figure 5:
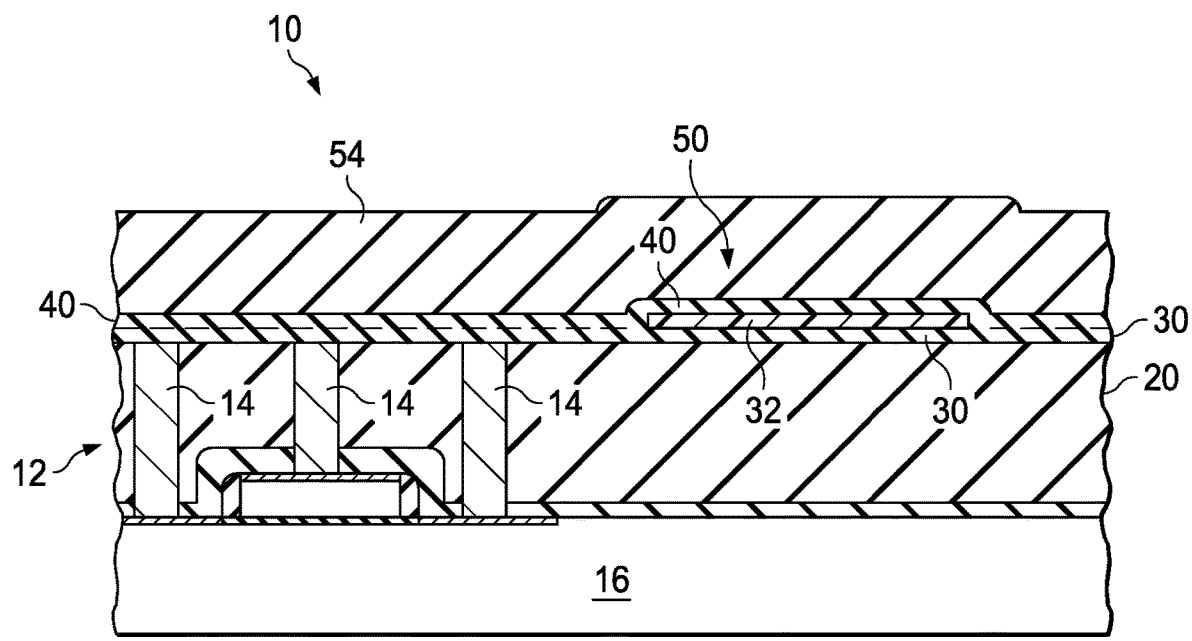

As shown in FIG. 5, an interconnect (e.g., metal 1) trench oxide layer 54 may be deposited over the second thin dielectric layer 40. As shown, the TFR film 32 may create a small upward bump in the interconnect trench oxide layer 54.

Figure 6:
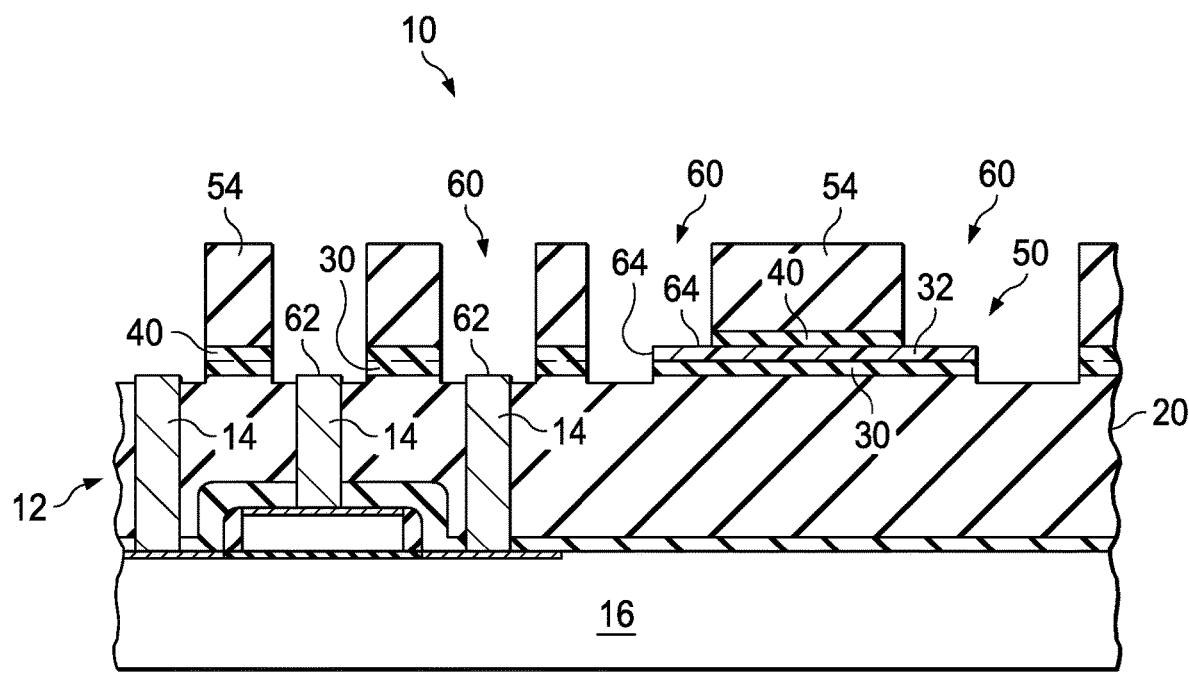

As shown in FIG. 6, a trench etch process may be performed to form openings 60 in the interconnect trench oxide layer 54 to expose upper surfaces 62 of the memory cell contacts 14 and upper and/or edge surfaces 64 of the TFR film 32, to define metal 1 lines to make electrical connections to the contacts 14 and TFR 50. The first and second thin dielectric layers 30 and 40 may act as etch stop layers to control the rate and/or depth of the etch at different locations of the structure. In some embodiments, the thicknesses of the deposited first and second thin dielectric layers 30 and 40 may be optimized, e.g., with different thicknesses, based on the requirements of both the TFR etch (shown in FIG. 3) and the subsequent interconnect trench etch (shown in FIG. 6).

Figure 7:
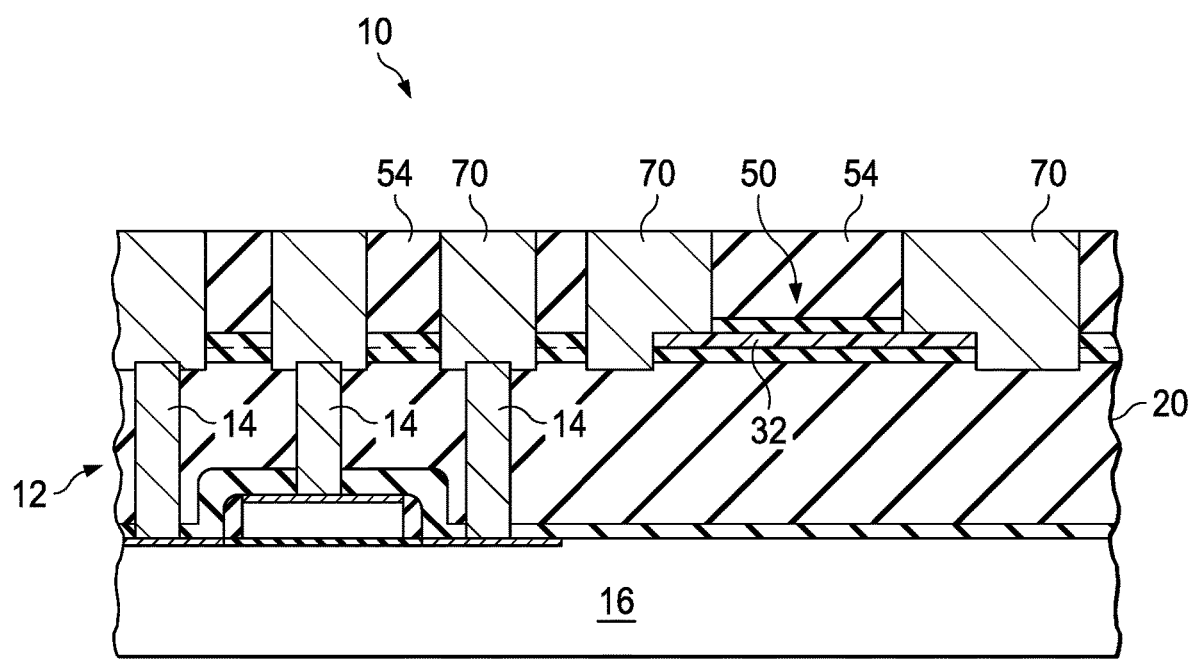

As shown in FIG. 7, interconnect material 70, e.g., copper, may then be deposited into the etched openings 60, to thereby make contact with the exposed contacts 14 and TFR 50.

As mentioned above, the dielectric layers 30 and 40 (e.g., SiN films) above and below the TFR film 32 (e.g., SiCCr film) can be tuned to different thicknesses based on the requirements of both the TFR etch and the subsequent interconnect (Metal 1) trench etch processes. For example, in some embodiments, a thickness of the first dielectric layer 30 when deposited is at least 25%, at least 50%, at least 75%, at least 100%, or at least 200% greater than a thickness of the second dielectric layer 40 when deposited. Thus, a thickness of the first dielectric layer 30 at a cross-section passing through the TFR film 32 may be at least 25%, at least 50%, at least 75%, at least 100%, or at least 200% greater than a thickness of the second dielectric layer 40. In other embodiments, a thickness of the second dielectric layer 40 when deposited is at least 25%, at least 50%, at least 75%, at least 100%, or at least 200% greater than a thickness of the first dielectric layer 30 when deposited. Thus, a thickness of the second dielectric layer 40 at a cross-section passing through the TFR film 32 may be at least 25%, at least 50%, at least 75%, at least 100%, or at least 200% greater than a thickness of the first dielectric layer 30.

By splitting the dielectric layers 30 and 40 into two deposition steps, the TFR film 32 can be selectively positioned (e.g., vertically) within the dielectric layers such that there is a sufficient etch stop layer (e.g., SiN layer 30) under the TFR film 32 during the TFR etch and to separately ensure that the dielectric layer 40 above the TFR film 32 is adequate for the interconnect trench etch process. This solution thus allows for tuning of the etch stops (e.g., SiN etch stops) for various TFR thicknesses and interconnect trench depths.

Another aspect of this solution is that the TFR film 32 may be integrated between the contacts 14 and interconnect layer 70 (e.g., metal 1). This may allow the TFR film 32 to be annealed to achieve a very low temperature coefficient.

The disclosed techniques may thereby provide these advantages using only a single mask and with copper metallization.

Although the disclosed embodiments are described in detail in the present disclosure, it should be understood that various changes, substitutions and alterations can be made to the embodiments without departing from their spirit and scope.

What is claimed is:

1. A method of forming an integrated thin film resistor (TFR) in a semiconductor integrated circuit device, the method comprising:
    forming an integrated circuit structure including at least one conductive contact;
    forming a first dielectric layer over the integrated circuit structure;
    forming a resistive film over a first portion of the first dielectric layer, but not over a second portion of the first dielectric layer;
    annealing the resistive film to reduce a temperature coefficient of resistance (TCR) of the resistive film;
    after the annealing the resistive film, forming a second dielectric layer including a first portion over and in contact with the resistive film and a second portion formed directly on the second portion of the first dielectric layer, such that the resistive film is arranged between the first dielectric layer and the first portion of the second dielectric layer, and such that the second portion of the first dielectric layer and the second portion of the second dielectric layer collectively define a combined dielectric thickness;
    forming an interconnect trench layer over the second dielectric layer;
    performing at least one etch process to define (a) at least one opening through the combined dielectric thickness of the second portion of the first dielectric layer and the second portion of the second dielectric layer to expose at least one surface of the at least one conductive contact and (b) at least one opening through the first portion of the second dielectric layer to expose at least one surface of the resistive film; and
    at least partially filling the openings with a conductive interconnect material to contact the exposed surfaces of the at least one conductive contact and the resistive film.

2. The method of claim 1, wherein the integrated circuit structure includes a memory cell or transistor structure including the at least one conductive contact connected to at least one of a source region, a drain region, and a gate region of the memory cell or transistor structure.

3. The method of claim 1, wherein the first and second dielectric layers comprise silicon nitride.

4. The method of claim 1, wherein the resistive film comprises silicon carbide chromium (SiCCr), silicon chromium (SiCr), chromium silicon nitride (CrSiN), tantalum nitride (TaN), tantalum silicide (Ta$_2$Si), or titanium nitride (TiN).

5. The method of claim 1, wherein the conductive interconnect material comprises copper.

6. The method of claim 1, wherein the interconnect trench layer comprises a dielectric material.

7. The method of claim 1, wherein a thickness of the formed first dielectric layer differs from a thickness of the formed second dielectric layer by at least 25% of the thickness of the formed first dielectric layer.

8. The method of claim 1, wherein a thickness of the formed first dielectric layer differs from a thickness of the formed second dielectric layer by at least 50% of the thickness of the formed first dielectric layer.

9. The method of claim 1, wherein a thickness of the formed first dielectric layer differs from a thickness of the formed second dielectric layer by at least 100% of the thickness of the formed first dielectric layer.

10. The method of claim 1, further comprising:
prior to forming the second dielectric layer over the resistive film, etching the resistive film to reduce a width of the resistive film, wherein the reduced-width resistive film does not cover a first conductive contact of the at least one conductive contact;
wherein the second dielectric layer is formed such that it extends over the reduced-width resistive film and over the first conductive contact; and
wherein the interconnect trench layer formed on the second dielectric layer is formed such that it extends over the reduced-width resistive film and over the first conductive contact, such that the first portion of the second dielectric layer is arranged between the interconnect trench layer and the reduced-width resistive film and the second portion of the second dielectric layer is arranged between the interconnect trench layer and the first conductive contact.

11. The method of claim 1, wherein the step of annealing the resistive film prior to forming the second dielectric layer and interconnect trench layer over the resistive film comprises a high temperature anneal.

12. The method of claim 1, wherein:
the resistive film is formed such that it extends over the at least one conductive contact of the integrated circuit structure;
the method further comprises, prior to forming the second dielectric layer over the resistive film:
annealing the resistive film; and
etching the resistive film to reduce a width of the resistive film such that the resistive film does not cover the at least one conductive contact of the integrated circuit structure.

* * * * *